(12) United States Patent
Abdo (10) Patent No.: US 9,548,742 B1
(45) Date of Patent: Jan. 17, 2017

(54) DRIVING THE COMMON-MODE OF A JOSEPHSON PARAMETRIC CONVERTER USING A THREE-PORT POWER DIVIDER

(71) Applicant: INTERNATIONAL BUSINESS MACHINES CORPORATION, Armonk, NY (US)

(72) Inventor: Baleegh Abdo, Carmel, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/754,243

(22) Filed: Jun. 29, 2015

(51) Int. Cl.
| H01P 5/12 | (2006.01) |
| H03K 19/195 | (2006.01) |
| H03K 3/38 | (2006.01) |
| H01P 5/103 | (2006.01) |

(52) U.S. Cl.
CPC .......... *H03K 19/1954* (2013.01); *H01P 5/103* (2013.01); *H01P 5/12* (2013.01); *H03K 3/38* (2013.01)

(58) Field of Classification Search
CPC ......... G01R 1/0416; G01R 15/14; H01P 5/12; H01P 5/103
USPC ......... 505/873, 874, 864; 307/277; 359/345; 333/218, 125, 277; 330/4.5
See application file for complete search history.

(56) References Cited

U.S. PATENT DOCUMENTS

| 5,378,999 | A | 1/1995 | Martens et al. |
| 5,604,925 | A | 2/1997 | O'Malley et al. |
| 6,281,746 | B1 * | 8/2001 | Wood .................. H03B 5/1817 330/4.5 |
| 7,388,710 | B2 * | 6/2008 | Ono ........................ G02F 1/395 359/326 |
| 7,570,075 | B2 | 8/2009 | Gupta et al. |
| 7,945,300 | B2 | 5/2011 | Kayano |
| 8,413,098 | B2 | 4/2013 | Ding et al. |
| 2007/0132481 | A1 * | 6/2007 | Chong ................. H03K 19/195 326/3 |
| 2008/0310000 | A1 * | 12/2008 | Beausoleil, Jr. ....... B82Y 10/00 359/108 |

OTHER PUBLICATIONS

Abdo, et al., "Josephson Directional Amplifier for Quantum Measurement of Superconducting Circuits", Department of Applied Physics, Yale University, New Haven, Connecticut, Apr. 2014, 5 pages.
Abdo, et al., "Nondegenerate Three-wave Mixing with the Josephson Ring Modulator, Department of Applied Physics", Yale University, New Haven, Connecticut, Jan. 2013, 18 pages.

(Continued)

*Primary Examiner* — Arnold Kinkead
(74) *Attorney, Agent, or Firm* — Tutunjian & Bitetto, P.C.; Vazken Alexanian (57) ABSTRACT

An on-chip Josephson parametric converter is provided. The on-chip Josephson parametric converter includes a Josephson ring modulator. The on-chip Josephson parametric converter further includes a lossless power divider, coupled to the Josephson ring modulator, having a single input port and two output ports for receiving a pump drive signal via the single input port, splitting the pump drive signal symmetrically into two signals that are equal in amplitude and phase, and outputting each of the two signals from a respective one of the two output ports. The pump drive signal excites a common mode of the on-chip Josephson parametric converter.

18 Claims, 5 Drawing Sheets

(56) References Cited

OTHER PUBLICATIONS

Bergeal et al., "Phase-preserving Amplification Near the Quantum Limit with a Josephson Ring Modulator", vol. 465|6, May 2010, pp. 64-69.
Hatridge, et al., "Dispersive Magnetometry with a Quantum Limited SQUID Parametric Amplifier", Department of Physics, University of California, Berkeley, California, Apr. 2011, 8 pages.
Vijay, et al., "Invited Review Article: The Josephson Bifrucation Amplifier", Quantum Nanoelectronics Laboratory, Department of Physics, University of California, Berkeley, California, Nov. 2009, 17 pages.

* cited by examiner

DRIVING THE COMMON-MODE OF A JOSEPHSON PARAMETRIC CONVERTER USING A THREE-PORT POWER DIVIDER

BACKGROUND

Technical Field

The present invention relates generally to electronic devices and, in particular, to driving the common-mode of a Josephson parametric converter using a three-port power divider.

Description of the Related Art

A Josephson ring modulator (JRM) is a nonlinear dispersive element based on Josephson tunnel junctions that can perform three-wave mixing of microwave signals at the quantum limit. The JRM consists of Josephson Junctions (JJs). In order to construct a non-degenerate parametric device that is the Josephson parametric converter (JPC), which is capable of amplifying and/or mixing microwave signals at the quantum limit, the JRM is coupled to two different microwave resonators.

In microstrip JPCs, as well as compact and shunted JPCs, the pump drive which provides the energy for the amplification process is fed through the sum port ($\Sigma$) of a 180 degree hybrid coupler. The difference port ($\Delta$) of the same hybrid is used to feed the differential modes signal or idler tones to the JPC. In this configuration, both the pump and the signal or idler are fed to the JPC through the same feedlines and coupling capacitors of the JPC (to which the 180 degree hybrid coupler is connected).

In amplification, the pump frequency is at the sum of the idler and signal frequencies and since the idler and signal frequencies are usually in the 4-15 Gigahertz range, the pump frequency is typically several Gigahertz apart from the signal and idler frequencies. Thus, in order to feed both the pump and signal or idler tones through the same hybrid, the hybrid needs to be broadband enough to accommodate those two different frequencies. For that purpose, existing JPCs use commercial broadband hybrids which are big in size and are off chip. The addition of this bulky hardware limits scalability. To solve this problem, one can design and implement broadband hybrids on-chip but this would add complexity to the design and fabrication processes. For example, if we couple two JPCs on the same chip to form a quantum-limited Josephson directional amplifier, placing the hybrids in plane would require wire cross-overs.

Feeding the pump and the signal (or idler) tones to the JPC through the same coupling capacitors poses a tradeoff between the device bandwidth and dynamic range. By increasing the coupling capacitors of the resonators, the device bandwidth increases since the coupling to the feedline (i.e., external circuit) increases, but it also increases the coupling to the second harmonic resonance of the microstrip resonator which the pump tone (the common mode) is close in frequency to. This softens the pump drive (makes it less "stiff") and consequently decreases the dynamic range of the JPC.

SUMMARY

According to an aspect of the present principles, an on-chip Josephson parametric converter is provided. The on-chip Josephson parametric converter includes a Josephson ring modulator. The on-chip Josephson parametric converter further includes a lossless power divider, coupled to the Josephson ring modulator, having a single input port and two output ports for receiving a pump drive signal via the single input port, splitting the pump drive signal symmetrically into two signals that are equal in amplitude and phase, and outputting each of the two signals from a respective one of the two output ports. The pump drive signal excites a common mode of the on-chip Josephson parametric converter.

According to another aspect of the present principles, a method is provided. The method includes forming an on-chip Josephson parametric converter. The forming step includes forming a Josephson ring modulator. The forming step further includes forming a lossless power divider, capacitively coupled to the Josephson ring modulator, having a single input port and two output ports for receiving a pump drive signal via the single input port, splitting the pump drive signal symmetrically into two signals that are equal in amplitude and phase, and outputting each of the two signals from a respective one of the two output ports. The pump drive signal excites a common mode of the on-chip Josephson parametric converter.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

The present principles are directed to driving the common-mode of a Josephson Parametric Converter (JPC) using a three-port power divider.

In the JPC, the incoming and outgoing signals to (in) and from (out) of the device travel on the same transmission lines and feedlines.

In an embodiment, we couple the pump drive and the signal (or idler) tones to the JPC using separate feedlines and coupling capacitors. The signal and idler tones would continue to be fed through the coupling capacitors of the JPC resonators, but the pump drive would be fed to the JPC through a lossless on-chip three-port power divider capacitively coupled to the Josephson ring modulator (JRM) of the JPC. The power divider would split the input signal equally between the two output ports and the split signals would have equal phase (in order to excite the common mode).

The present principles provide many attendant advantages over the prior art. Some of these many attendant advantages will now be described.

As an advantage, hybrid couplers are not needed for feeding or driving the JPC. The new excitation method yields a smaller footprint and involves a simpler design and fabrication processes. Obviously, it is advantageous not to use hybrids at all because they might require wire crossovers but if for some reason it is not an issue (due to the use of advanced and reliable fabrication process), the main advantage is that the pump drive does not need to share a hybrid or physical port with the input and output signals. Also, in the case that hybrids are used, the hybrids do not need to be broadband covering a large bandwidth (usually >10 GHz).

As another advantage, the power divider can be implemented on chip and it is lossless. It does not need to be broadband. Also, capacitively coupling the power divider to the JRM allows us to strongly couple to the common-mode of the JPC, which we want to drive (i.e., the pump), and at the same time weakly couple to the differential modes, which we want to preserve (i.e., the signal and idler). This last statement is especially true in microstrip JPCs where the odd Eigenmodes of the resonators have an RF-voltage node at the JRM location, whereas the even Eigenmodes of the resonators have an RF-voltage anti-node at the JRM location.

As yet another advantage, the pump, signal, and idler tones can be fed to the JPC through different feedlines which can be implemented at separate physical locations on chip, thus facilitating integration with other JPCs.

As still another advantage, the dynamic range of microstrip JPCs can be increased by making the pump drive stiffer without affecting the device bandwidth. This can be achieved by, for example, decreasing the coupling capacitors to the JRM and also incorporating microwave filters into the feedlines of the resonators which block the pump drive from leaking out through these feedlines.

Figure 1:
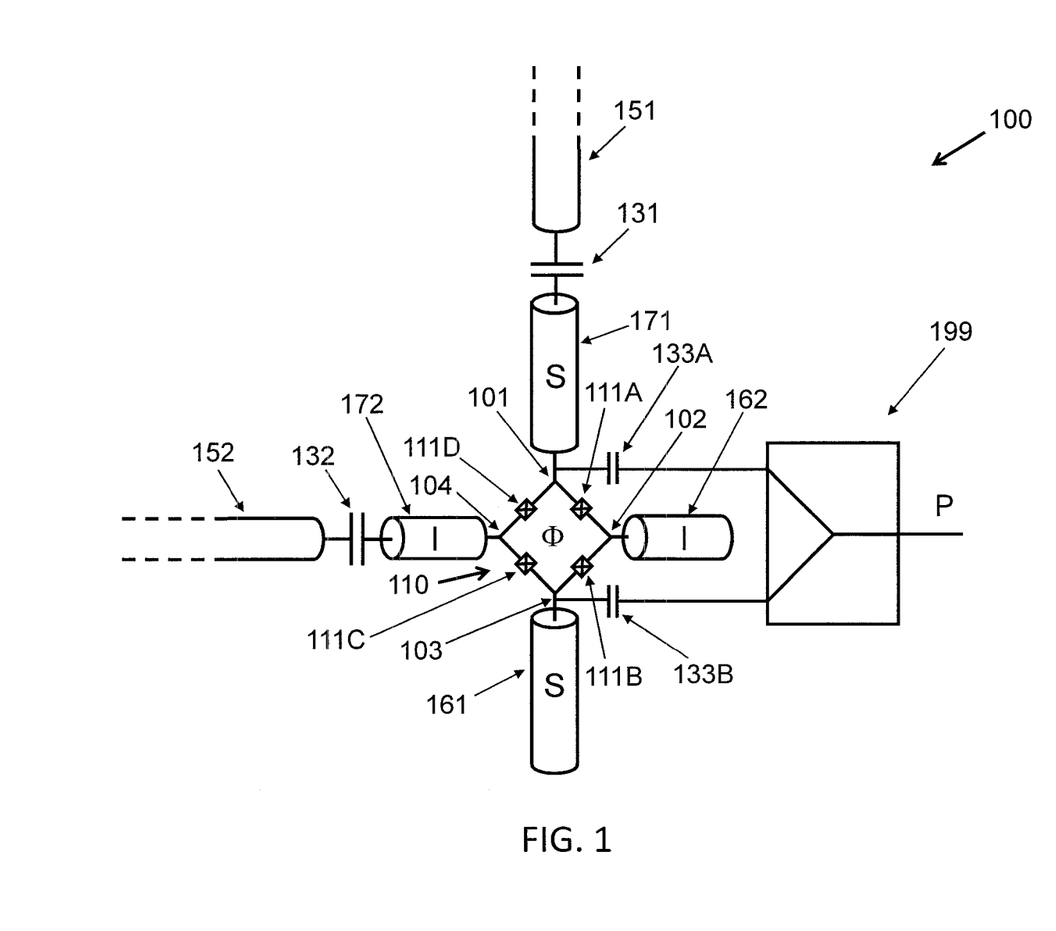
FIG. 1 shows an exemplary circuit for a Josephson Parametric Converter (JPC) 100 having a common-mode driven using a power divider, in accordance with an embodiment of the present principles.

FIG. 1 shows an exemplary circuit for a Josephson Parametric Converter (JPC) 100 having a common-mode driven using a power divider, in accordance with an embodiment of the present principles.

The JPC 100 includes a Josephson ring modulator (JRM) 110. The JRM 110 includes four nodes 101, 102, 103, and 104. The JRM 110 further includes Josephson junctions 111A, 111B, 111C, and 111D arranged in a Wheatstone Bridge-like configuration with respect to the four nodes 101-104 (that is, in a ring configuration with the nodes 101-104 inter-dispersed between the junctions 111A-111D), where junction 111A is between nodes 101 and 102, junction 111B is between nodes 102 and 103, junction 111C is between nodes 103 and 104, and junction 111D is between nodes 104 and 101. The Josephson junctions 111A-D form a superconducting loop threaded by an applied magnetic flux Φ. In an embodiment, the flux bias applied to the ring is half a flux-quantum. Of course, other amounts can also be used, depending upon the application. In particular, if a flux-tunable version of the JRM is implemented where each JJ in the JRM is shunted by a linear inductance.

The JPC 100 also includes 2 transmission line resonators that intersect at the JRM 110, namely, a signal (S) resonator which include two transmission lines 171 and 161 of length $l_s/2$ each, connected together by the JRM, and an idler resonator (I) which include two transmission lines 172 and 162 of length $l_i/2$ each connected together by the JRM. The signal (S) resonator is excited by a signal (S) tone, while the idler (I) resonator is excited by an idler (I) tone. "Signal (S)" is interchangeably denoted herein as "signal 1", while idler (I) is interchangeably denoted herein as "signal 2". The respective lengths of the signal (S) and the idler (I) transmission line resonators and the Josephson inductance of the JRM 110 at the device working point (i.e., the flux bias threading the JRM loop) determine the resonance frequencies of the JPC 100. In general, $l_s \approx \lambda_s/2$ and $l_i \approx \lambda_i/2$, where $\lambda_s$ and $\lambda_i$ correspond to the wavelength of the fundamental mode of the S and I resonators respectively. The signal (S) resonator and the idler (I) resonator support a different one of two differential Eigenmodes of the JRM 110.

The (differential) signal (S) tone is fed to nodes 101 and 103 of the JRM 100 through feedline 151 via a coupling capacitor 131. The (differential) idler (I) tone is fed to nodes 102 and 104 of the JRM 100 through feedline 152 via a coupling capacitor 132. A third tone, denoted as pump (P), is non-resonant and is input to nodes 101 and 103 of the JRM 110 via a lossless on-chip power divider 199 capacitively coupled to the JRM 110 via coupling capacitors 133A and 133B. Both the signal (S) Eigenmode and the idler (I) Eigenmode are excited differentially, while the pump (P) is a common-mode drive. The linear bandwidth of the signal (S) resonator and idler resonator (I) is mainly set by the coupling capacitors which couple the signal (S) resonator and idler resonator (I) to the respective feedlines. Thus, the signal (S) and the idler (I) tones, which lie within the bandwidths of the signal (S) resonator and idler resonator (I), couple to the differential modes of the JRM 110, while the pump (P) drive couples to the common-mode of the JRM 110. Denoting the frequency of the signal (S) tone $f_S$, the frequency of the idler (I) tone $f_I$, and assuming, without loss of generality, that $f_I > f_S$, the frequency of the pump drive $f_P$ is set to either the sum $f_I + f_S$ (amplification) or the difference $f_I - f_S$ (frequency conversion without photon gain).

It is to be appreciated that one of more embodiments here describe a specific implementation of a JPC in which the resonators included therein are realized using transmission line resonators. However, the present principles are not limited to this particular implementation and, thus, JPCs having other elements and/or other configurations can also be used in accordance with the teachings of the present principles, while maintaining the spirit of the present principles. For example, in other embodiments, the resonators can be implemented using lumped-elements. The preceding also applies to the JRM in that the present principles are not limited to the specific JRM configuration shown herein.

Figure 2:
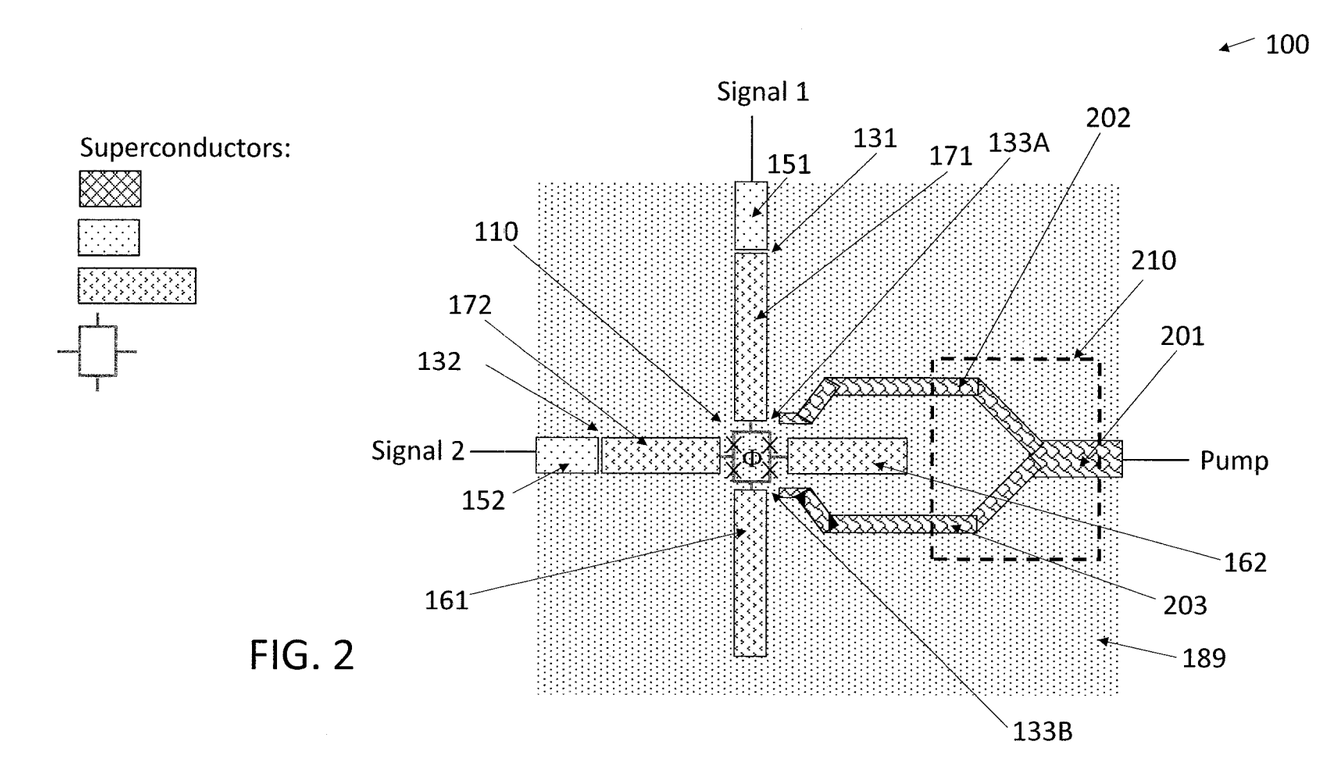
FIG. 2 an exemplary implementation layout for the Josephson Parametric Converter (JPC) 100 of FIG. 1, in accordance with an embodiment of the present principles.

FIG. 2 an exemplary implementation layout for a Josephson Parametric Converter (JPC) 200 having a common-mode driven using a power divider, in accordance with an embodiment of the present principles.

The JPC 100 includes a dielectric substrate 210 on which the JRM 110 is disposed. The JPC 100 also includes two microstrip resonators that intersect at the JRM 110, namely, the signal (S) resonator which includes two microstrip lines 171 and 161, each connected together by the JRM 110, and the idler resonator (I) which includes two microstrip lines 172 and 162, each connected together by the JRM 110. As noted above, signal (S)" is interchangeably denoted herein as "signal 1", while idler (I) is interchangeably denoted herein as "signal 2".

The JPC 110 includes a three-port power divider 210 having an input port 201, and two output ports 202 and 203 which are capacitively coupled to the JRM 110 via capacitors 133A and 133B. Feedline 151 is the feedline for signal 1, and feedline 152 is the feedline for signal 2.

Capacitor 131 couples the Signal (S) tone to the JRM 110, capacitor 132 couples the Idler (I) tone to the JRM 110, and capacitors 133A and 133B couple the pump (P) drive tone to the JRM 110.

Figure 3:
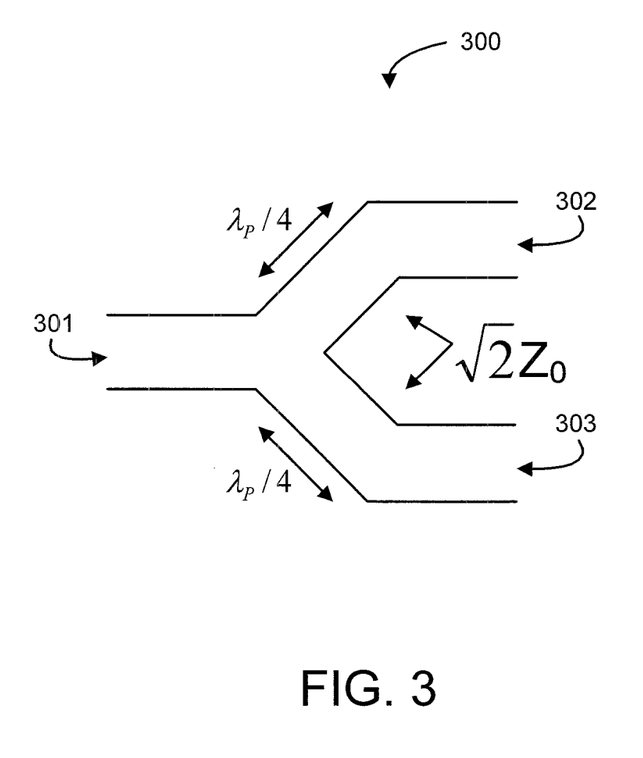
FIG. 3 shows a three-port power divider circuit 300, in accordance with an embodiment of the present principles.
Figure 4:
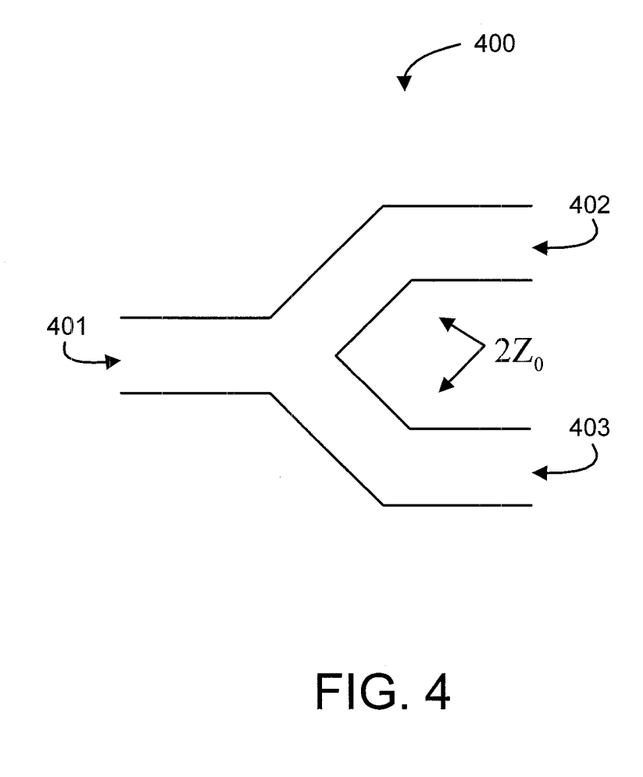
FIG. 4 shows another three-port power divider circuit 400, in accordance with an embodiment of the present principles.

FIGS. 3 and 4 herein after show respective three-port power divider circuits in accordance with embodiments of the present principles. It is to be appreciated that the present principles are not limited to solely the power divider circuits shown in FIGS. 3 and 4, and other power divider circuits, as well as modified versions of those shown in FIGS. 3 and 4, can be used in accordance with the teachings of the present principles, while maintaining the spirit of the present principles.

FIG. 3 shows an exemplary three-port power divider circuit 300, in accordance with an embodiment of the present principles.

The power divider circuit 300 shows a transmission line model of the divider. The power divider circuit is a lossless variation of the lossy Wilkinson power divider. The divider includes three sections. The first section includes an input line of characteristic impedance $Z_0$. The second section includes a junction in which the input line is split into two transmission lines of characteristic impedance $\sqrt{2}Z_0$ and length $\pi_P/4$, where $\lambda_P$ is the wavelength of the pump drive. The third section includes two transmission lines of characteristic impedance $Z_0$. This divider has three ports 301-303. Port 301 is defined on the input line. Ports 302 and 303 are defined on the output lines. This divider functions as a 3 dB divider. A pump drive at wavelength $\lambda_P$ and power $P_p$ input on port 301 is divided into two equal signals which are transmitted to ports 302 and 303. Due to the symmetry of the structure the output signals on ports 302 and 303 will have equal phases. Thus, the first port 301 of characteristic impedance $Z_0$ receives a pump tone having a wavelength of $\lambda_P$ and power $P_p$. The second port 302 and third port 303 of characteristic impedance $Z_0$ output respective power-divided pump signals with power $P_p/2$ and equal microwave phase due to the symmetry of the structure. In an embodiment, the three-port power divider consists of two quarter wave transmission lines (of length $\lambda_P/4$) and characteristic impedance $\sqrt{2}Z_0$ which connect between port 301 and ports 302-303. The input line in this divider is matched if the output lines are matched. However, matching the input line is less critical for the pump drive. Also, in this divider there is no isolation between the output lines, however the symmetry of the divider ensures that the steady state phases of the driven signals on the output ports are equal. In an embodiment, the power divider circuit 300 can be also implemented by an equivalent lumped-element circuit.

FIG. 4 shows exemplary another three-port power divider circuit 400, in accordance with an embodiment of the present principles.

The power divider circuit 400 includes a first port 401, a second port 402, and a third port 403. This power divider is known as lossless T-junction based on transmission lines. The three ports are defined on three transmission lines, i.e. input line and two output lines. Port 401 is defined on the input line, ports 402 and 403 are defined on the output lines. The characteristic impedance of the input line is $Z_0$, while the impedance of the two output lines is $2Z_0$. This choice of characteristic impedances implements a 3 dB power divider, where a pump drive entering port 401 at frequency $f_p$ is split in half. Half of the power is delivered to port 402 and the other half to port 403. Due to symmetry, the split signals on both ports have the same phase. If necessary, quarter-wave transformers can be used to bring the output line impedances to a different desired value. It is important to note that in this divider the input line is matched if the output lines are matched. However, matching the input line is less critical for the pump drive. Also, in this divider there is no isolation between the output lines, however the symmetry of the divider ensures that the steady state phases of the driven signals on the output ports are equal. In an embodiment, the power divider circuit 400 is implemented by an equivalent lumped-element circuit.

In the embodiments of FIGS. 3 and 4, the power dividers 300 and 400 are reciprocal devices, meaning that the transmission from one port to another is the same in both directions. One important consequence of the device having three ports and being lossless and reciprocal is that it cannot be matched on all ports. Matched means that power sent into one port will not have some portion of it reflected back. In the proposed device, matching is less important.

In an embodiment, a microwave filter is added to the power divider itself (possibly to both port 2 and 3 or to port 1), in order to block any possible signal leakage from the JPC through the power divider.

Figure 5:
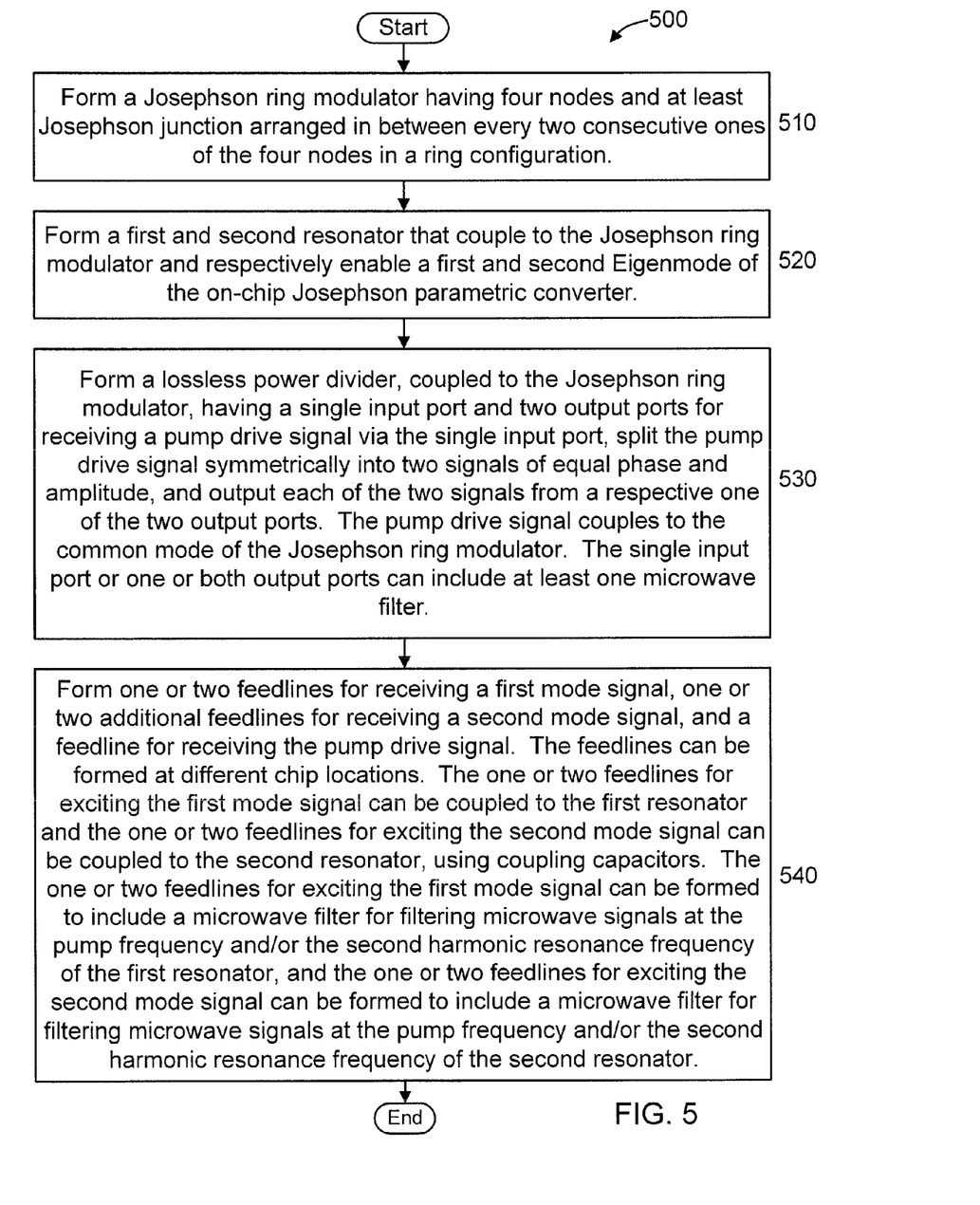
FIG. 5 shows an exemplary method 500 for forming a Josephson Parametric Converter (JPC) 100 having a common-mode driven using a three-port power divider, in accordance with an embodiment of the present principles.

FIG. 5 shows an exemplary method 500 for forming a Josephson Parametric Converter (JPC) 100 having a common-mode driven using a three-port power divider, in accordance with an embodiment of the present principles. It is to be appreciated that one or more steps have been omitted from method 500 for the sake of brevity, but are readily apparent to one of ordinary skill in the art given the teachings of the present principles provided herein.

At step 510, form a Josephson ring modulator having four nodes and at least Josephson junction arranged in between every two consecutive ones of the four nodes in a ring configuration.

At step 520, form a first and a second resonator that couple to the Josephson ring modulator and respectively enable a first and a second Eigenmode of the on-chip Josephson parametric converter.

At step 530, form a lossless power divider, coupled to the Josephson ring modulator, having a single input port and two output ports for receiving a pump drive signal via the single input port, split the pump drive signal symmetrically into two signals of equal phase and amplitude, and output each of the two signals from a respective one of the two output ports. The pump drive couples to the common mode of the JRM. In an embodiment, the lossless power divider is formed to include at least one microwave filter at the single input port or one or both output ports, in order to block any possible signal leakage from the JPC through the power divider.

At step 540, form one or two feedlines for receiving a first mode signal, one or two additional feedlines for receiving a second mode signal, and a feedline for receiving the pump drive. In an embodiment, the feedlines are formed at different chip locations. In an embodiment, the feedlines for exciting the first mode signal are coupled to the first resonator through coupling capacitors. Likewise, the feedlines for exciting the second mode signal are coupled to the second resonator through coupling capacitors.

In an embodiment, the feedlines for exciting the first mode signal can be formed to include a microwave filter for filtering signals at the pump frequency and/or the second harmonic resonance frequency of the first resonator, and the feedlines for exciting the second mode signal can be formed to include a microwave filter for filtering signals at the pump frequency and/or the second harmonic resonance frequency of the second resonator. The preceding technique can be used to increase the bandwidth of a microstrip-implemented JPC by increasing the coupling between the fundamental modes of the JPC resonators and the feedlines without increasing the coupling between the second harmonic resonances of the JPC and the feedlines which can result in a decrease in the stiffness of the pump when the device is used as a phase-preserving amplifier.

In an embodiment, the feedlines are formed to include a coupling capacitor for coupling a respective one of the feedlines to the Josephson ring modulator.

A description will now be given regarding some exemplary applications to which the present principles can be applied.

The present principles can be used in the readout of solid state qubits such as superconducting qubits and quantum dots. For example, the present principles can be used to enhance the measurement fidelity, and allow for scalable readout architectures. The present principles can also be used, in general, to perform sensitive quantum measurements in the microwave domain, such as measuring nano-mechanical systems coupled to microwave resonators.

The present principles can be used in building wideband, large input power quantum-limited Josephson directional amplifiers and also on-chip dissipationless circulators. The present principles can be used (similar to Josephson parametric converters but with enhanced performance) as ideal microwave mixers (performing upconversion and downconversion of microwave frequency without dissipation), controllable microwave beam-splitters, and fast, lossless microwave switches.

The present principles can also find some applications in improving the sensitivity of microwave measurements in the areas of astronomy and cosmology.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. An on-chip Josephson parametric converter, comprising:
   a Josephson ring modulator; and
   a lossless power divider, coupled to the Josephson ring modulator, having a single input port and two output ports for receiving a pump drive signal via the single input port, splitting the pump drive signal symmetrically into two signals that are equal in amplitude and phase, and outputting each of the two signals from a respective one of the two output ports,
   wherein the pump drive signal excites a common mode of the on-chip Josephson parametric converter, and
   wherein the lossless power divider comprises at least one microwave filter for at least mitigating any signal leakage from the on-chip Josephson parametric converter through the lossless power divider.

2. The on-chip Josephson parametric converter of claim 1, further comprising one or more coupling capacitors for capacitively coupling the lossless power divider to the Josephson ring modulator.

3. The on-chip Josephson parametric converter of claim 1, further comprising a plurality of feedlines for receiving a first mode signal, and a second mode signal, and the pump drive signal.

4. The on-chip Josephson parametric converter of claim 3, wherein at least some of the plurality of feedlines are disposed at different on-chip locations.

5. The on-chip Josephson parametric converter of claim 3, further comprising a first resonator and a second resonator that intersect at the Josephson ring modulator and respectively enable a first and a second differential mode of the on-chip Josephson parametric converter, and wherein at least some of the plurality of feedlines are connected to the first and second resonators and comprise a respective microwave filter for filtering microwave signals at at least one of a pump frequency and second harmonic resonance frequencies of the first and second resonators.

6. The on-chip Josephson parametric converter of claim 3, further comprising respective coupling capacitors for coupling respective ones of the at least some of the plurality of feedlines to the Josephson ring modulator.

7. The on-chip Josephson parametric converter of claim 1, wherein the lossless power divider is a passive device consisting of one or more passive elements.

8. The on-chip Josephson parametric converter of claim 1, wherein the lossless power divider comprises a three port passive element.

9. The on-chip Josephson parametric converter of claim 1, wherein the lossless power divider comprises lumped-circuit elements.

10. The on-chip Josephson parametric converter of claim 1, further comprising transmission lines and feedlines, wherein the incoming signals to and outgoing signals from the lossless power divider travel on same ones of the transmission lines and same ones of the feedlines.

11. The on-chip Josephson parametric converter of claim 1, wherein the at least one microwave filter is provided at the single input port or at one or both of the two output ports of the lossless power divider.

12. A method, comprising:
   forming an on-chip Josephson parametric converter, wherein said forming step includes:
   forming a Josephson ring modulator; and
   forming a lossless power divider, capacitively coupled to the Josephson ring modulator, having a single input port and two output ports for receiving a pump drive signal via the single input port, splitting the pump drive signal symmetrically into two equal phase signals, and outputting each of the two equal phase signals from a respective one of the two output ports, wherein the pump drive signal excites a third mode that is a common mode of the on-chip Josephson parametric converter, and wherein the lossless power divider is formed to include at least one microwave filter for at least mitigating any signal leakage from the on-chip Josephson parametric converter through the lossless power divider.

13. The method of claim 12, further comprising forming a coupling capacitor for capacitively coupling the lossless power divider to the Josephson ring modulator.

14. The method of claim 12, further comprising forming a plurality of feedlines, each for respectively carrying incoming and outgoing waves of a first mode signal, and a second mode signal, and the pump signal.

15. The method of claim 14, further comprising:

forming a first and a second resonator that intersect at the Josephson ring modulator and respectively enable a first and a second mode of the on-chip Josephson parametric converter; and connecting at least some of the plurality of feedlines to the first and second resonators, and wherein forming a plurality of feedlines comprises forming a respective microwave filter in each of the at least some of the plurality of feedlines for filtering microwave signals at the pump frequency and/or the respective second harmonic resonance frequencies of the first and second resonators.

16. The method of claim 12, wherein the lossless power divider is formed as a passive device consisting of one or more passive elements.

17. The method of claim 12, wherein the lossless power divider is formed using lumped-circuit elements.

18. The method of claim 12, further comprising:

forming transmission lines and feedlines; and configuring the on-chip Josephson parametric converter to operate such that incoming signals to and outgoing signals from the on-chip Josephson parametric converter travel on same ones of the transmission lines and same ones of the feedlines.

\* \* \* \* \*